US012641862B2

(12) United States Patent
Schultz

(10) Patent No.: US 12,641,862 B2
(45) Date of Patent: May 26, 2026

(54) THREE-DIMENSIONAL CROSS FIELD EFFECT SELF-ALIGNED TRANSISTORS WITH FRONTSIDE AND BACKSIDE POWER CONNECTIONS

(71) Applicant: Advanced Micro Devices, Inc., Santa Clara, CA (US)

(72) Inventor: Richard T. Schultz, Ft. Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 804 days.

(21) Appl. No.: 18/055,341

(22) Filed: Nov. 14, 2022

(65) Prior Publication Data

US 2024/0162320 A1 May 16, 2024

(51) Int. Cl.
H10D 84/01 (2026.01)
H10D 30/67 (2025.01)
(Continued)

(52) U.S. Cl.
CPC ..... H10D 84/0128 (2025.01); H10D 30/6735 (2025.01); H10D 30/6755 (2025.01);
(Continued)

(58) Field of Classification Search
CPC ............. H01L 21/76895; H01L 23/481; H01L 23/528; H01L 23/5286;
(Continued)

(56) References Cited

U.S. PATENT DOCUMENTS 6,156,600 A 12/2000 Chao et al.
7,723,806 B2 5/2010 Liaw
(Continued)

FOREIGN PATENT DOCUMENTS

EP 3979305 A1 4/2022
JP S6035564 A 2/1985
(Continued)

OTHER PUBLICATIONS

Invitation to Pay Additional Fees and, Where Applicable, Protest Fee in International Application No. PCT/US2023/079199, date mailed Mar. 19, 2024, 14 pgs.
International Search Report and Written Opinion in International Application No. PCT/US2023/079199, date mailed Jun. 5, 2024, 23 pgs.

(Continued)

*Primary Examiner* — Cheung Lee
(74) *Attorney, Agent, or Firm* — Kowert, Hood, Munyon, Rankin & Goetzel, P.C.; Rory D. Rankin

(57) ABSTRACT

An apparatus and method for efficiently routing power signals across a semiconductor die. In various implementations, an integrated circuit uses Cross field effect transistors (FETs) with a first device, such as n-type device, having a first channel oriented in a first direction and connected to a ground reference voltage level provided by a backside metal layer. The Cross FETs also use a second device, such as the p-type device, having a second channel oriented in a second direction orthogonal to the first direction and connected to a power supply reference voltage level provided by a frontside metal layer. A micro through silicon via (TSV) traverses the silicon substrate layer in order to be placed between the backside metal layer and the source region of an n-type device. The power connections reduce on-die area, reduces semiconductor fabrication complexity, which improves wafer yield, and reduces voltage droop, which increases performance.

20 Claims, 10 Drawing Sheets

(51) Int. Cl.

| | |
|---|---|
| *H10D 62/10* | (2025.01) |
| *H10D 84/03* | (2025.01) |
| *H10D 84/83* | (2025.01) |
| *H10D 88/00* | (2025.01) |
| *H10W 20/20* | (2026.01) |
| *H10W 20/41* | (2026.01) |

(52) U.S. Cl.
CPC ....... *H10D 30/6757* (2025.01); *H10D 62/121* (2025.01); *H10D 84/0149* (2025.01); *H10D 84/038* (2025.01); *H10D 84/834* (2025.01); *H10D 88/00* (2025.01); *H10W 20/20* (2026.01); *H10W 20/427* (2026.01)

(58) Field of Classification Search
CPC ..... H10D 30/501–509; H10D 30/6735; H10D 30/674; H10D 30/6755; H10D 30/6757; H10D 62/121; H10D 64/254; H10D 64/256–2565; H10D 64/257; H10D 84/01; H10D 84/0128; H10D 84/0149; H10D 84/0167; H10D 84/0186; H10D 84/038; H10D 84/83; H10D 84/8311; H10D 84/8312; H10D 84/83125; H10D 84/83135; H10D 84/83138; H10D 84/8314; H10D 84/8316; H10D 84/832–833; H10D 84/834; H10D 84/835; H10D 84/836; H10D 84/837–839; H10D 88/00
See application file for complete search history.

(56) References Cited

U.S. PATENT DOCUMENTS

| | | | |
|---|---|---|---|
| 8,063,450 | B2 | 11/2011 | Wernersson et al. |
| 8,561,003 | B2 | 10/2013 | Kawa et al. |
| 9,425,318 | B1 | 8/2016 | Hoentschel et al. |
| 9,704,995 | B1 | 7/2017 | Schultz |
| 10,068,794 | B2 | 9/2018 | Schultz |
| 10,186,510 | B2 | 1/2019 | Schultz |
| 10,304,728 | B2 | 5/2019 | Schultz |
| 10,608,076 | B2 | 3/2020 | Schultz |
| 11,120,190 | B2 | 9/2021 | Schultz |
| 11,189,569 | B2 | 11/2021 | Schultz et al. |
| 2001/0041402 | A1 | 11/2001 | Yamamoto |
| 2006/0216897 | A1 | 9/2006 | Lee et al. |

| | | | |
|---|---|---|---|
| 2007/0157144 | A1 | 7/2007 | Mai et al. |
| 2007/0170471 | A1 | 7/2007 | Joly et al. |
| 2007/0278528 | A1 | 12/2007 | Ato et al. |
| 2009/0187871 | A1 | 7/2009 | Cork |
| 2010/0148219 | A1 | 6/2010 | Shimizu |
| 2011/0151668 | A1 | 6/2011 | Tang et al. |
| 2012/0007051 | A1 | 1/2012 | Bangsaruntip et al. |
| 2012/0138886 | A1 | 6/2012 | Kuhn et al. |
| 2013/0155753 | A1 | 6/2013 | Moon et al. |
| 2013/0161792 | A1 | 6/2013 | Tran et al. |
| 2014/0106474 | A1 | 4/2014 | Chen et al. |
| 2014/0145342 | A1 | 5/2014 | Schultz et al. |
| 2014/0183643 | A1 | 7/2014 | Colinge et al. |
| 2014/0374879 | A1 | 12/2014 | Chen et al. |
| 2015/0061087 | A1 | 3/2015 | Hong |
| 2015/0144880 | A1 | 5/2015 | Rachmady et al. |
| 2015/0243519 | A1 | 8/2015 | deVilliers |
| 2015/0295036 | A1 | 10/2015 | Hong |
| 2015/0370951 | A1 | 12/2015 | Kawa et al. |
| 2015/0372104 | A1 | 12/2015 | Liu et al. |
| 2019/0304974 | A1 | 10/2019 | Sharma et al. |
| 2019/0319021 | A1 | 10/2019 | Xu et al. |
| 2020/0035560 | A1 | 1/2020 | Block et al. |
| 2020/0279847 | A1 * | 9/2020 | Pillarisetty ........... H10D 84/856 |
| 2021/0074350 | A1 | 3/2021 | Vincent et al. |
| 2021/0134642 | A1 | 5/2021 | Or-Bach et al. |
| 2021/0376137 | A1 | 12/2021 | Yang et al. |
| 2022/0320299 | A1 | 10/2022 | Chen |

FOREIGN PATENT DOCUMENTS

| | | | |
|---|---|---|---|
| WO | 2014051769 | A1 | 4/2014 |
| WO | 2015199644 | A1 | 12/2015 |

OTHER PUBLICATIONS

International Search Report and Written Opinion in International Application No. PCT/US2022/076562, mailed Dec. 19, 2022, 16 pages.

International Search Report and Written Opinion in International Application No. PCT/US2017/052339, mailed Dec. 6, 2017, 15 pages.

Dargis et al., "Epitaxial Growth and Properties of Silicon on Crystalline Rare-Earth-Metal Oxide for SOI-Applications", Materials Science, May 1, 2009, pp. 11-15, vol. 15, No. 1.

Schultz, Richard T., U.S. Appl. No. 17/489,221, entitled "Cross Field Effect Transistor (XFET) Architecture Process", filed Sep. 29, 2021, 37 pages.

* cited by examiner

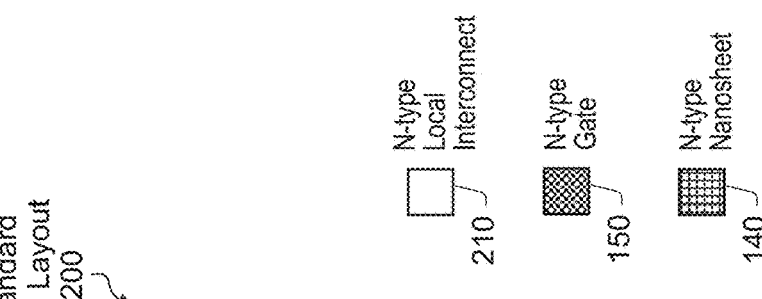
Standard Cell Layout 200
210 — N-type Local Interconnect
150 — N-type Gate
140 — N-type Nanosheet
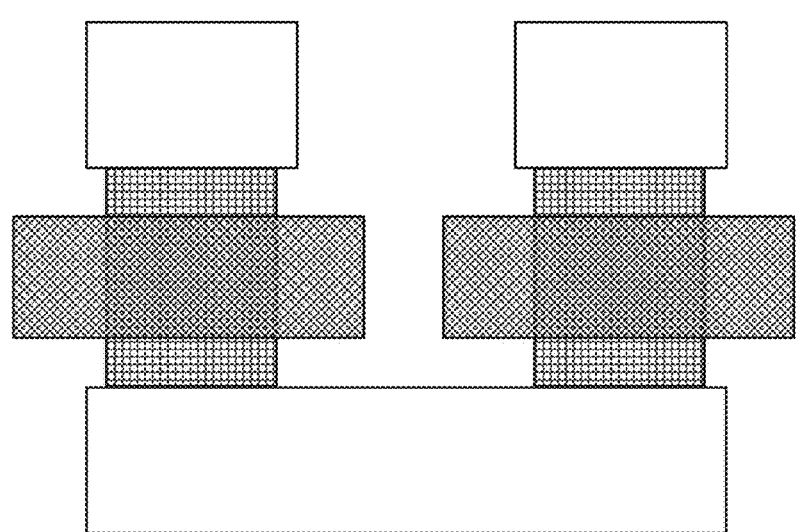
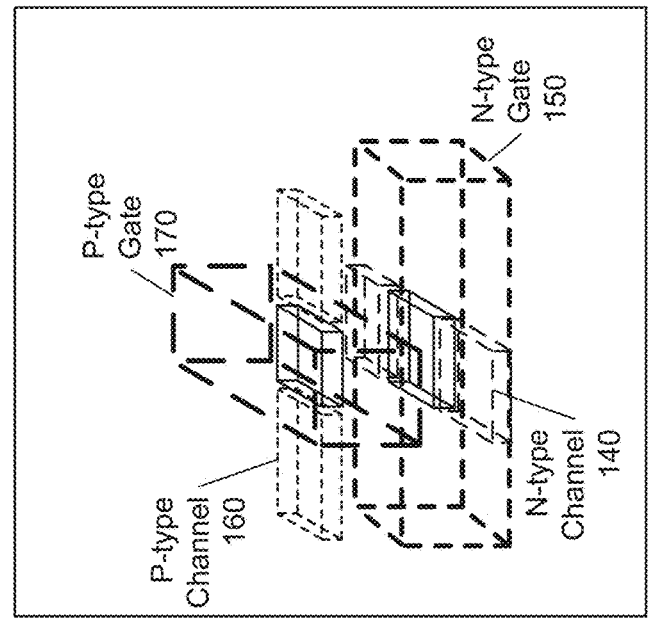
P-type Gate 170
N-type Gate 150
P-type Channel 160
N-type Channel 140
FIG. 2

Standard
Cell Layout
300
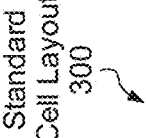
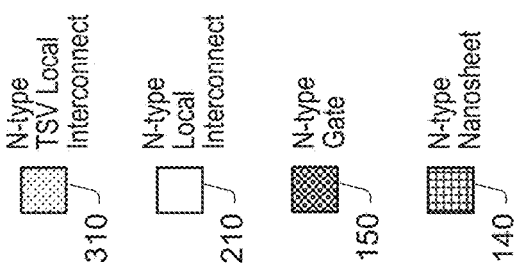
N-type
TSV Local
Interconnect
310
N-type
Local
Interconnect
210
N-type
Gate
150
N-type
Nanosheet
140
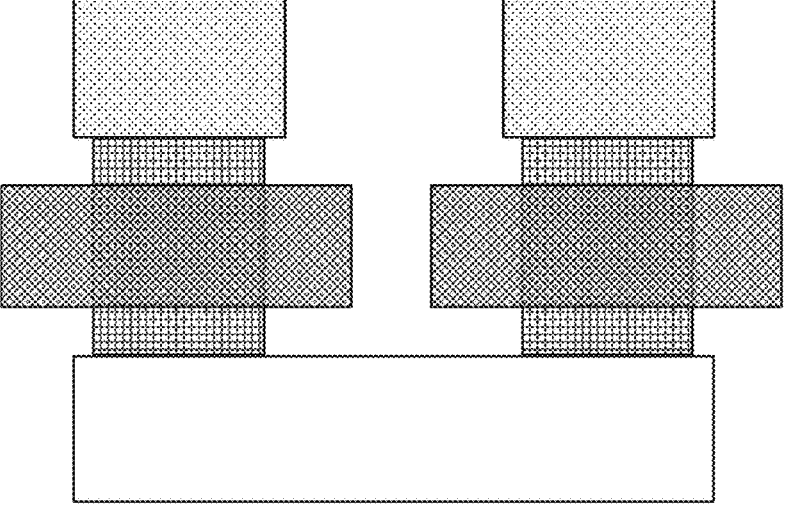
FIG. 3

Standard
Cell Layout
400

Contact
(N-type Gate to
P-type Gate)

410

N-type
TSV Local
Interconnect

310

N-type
Local
Interconnect

210

N-type
Gate

150

N-type
Nanosheet

140

Contact
(N-type Local
Interconnect to
P-type Local
Interconnect)

420

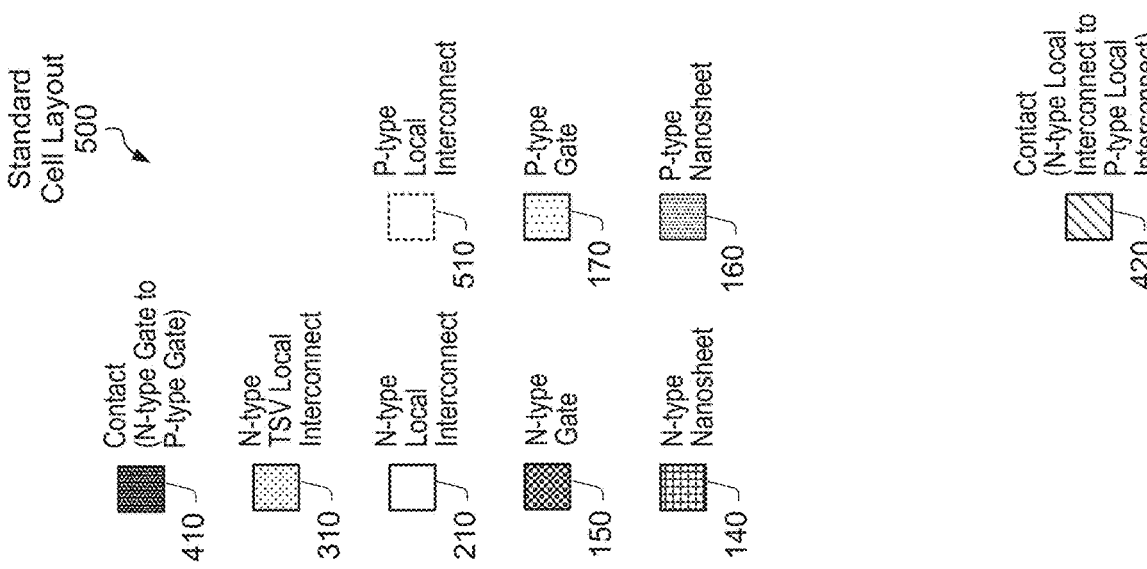
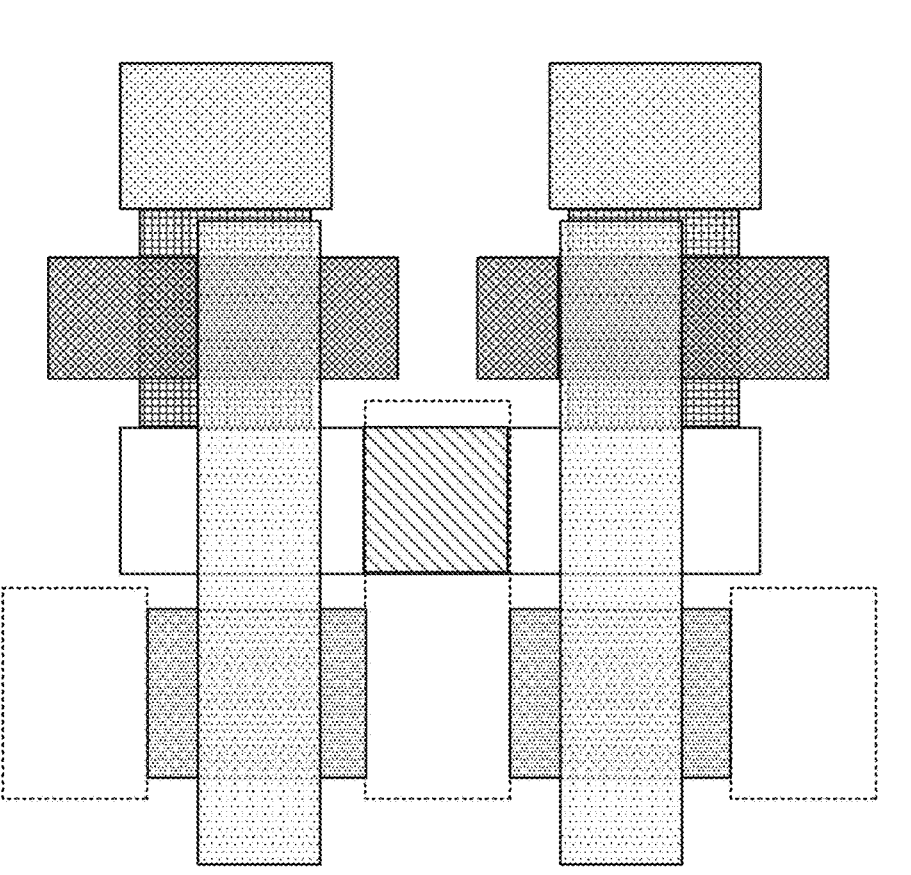
FIG. 5

Standard
Cell Layout
600

Contact
(N-type Gate to
P-type Gate)
410

N-type
TSV Local
Interconnect
310

N-type
Local
Interconnect
210

N-type
Gate
150

N-type
Nanosheet
140

P-type
Local
Interconnect
510

P-type
Gate
170

P-type
Nanosheet
160

Contact
(P-type Local
Interconnect to
Frontside M0
Layer)
610

Contact
(N-type Local
Interconnect to
P-type Local
Interconnect)
420

Contact
(P-type Gate to
Frontside M0
Layer)
620

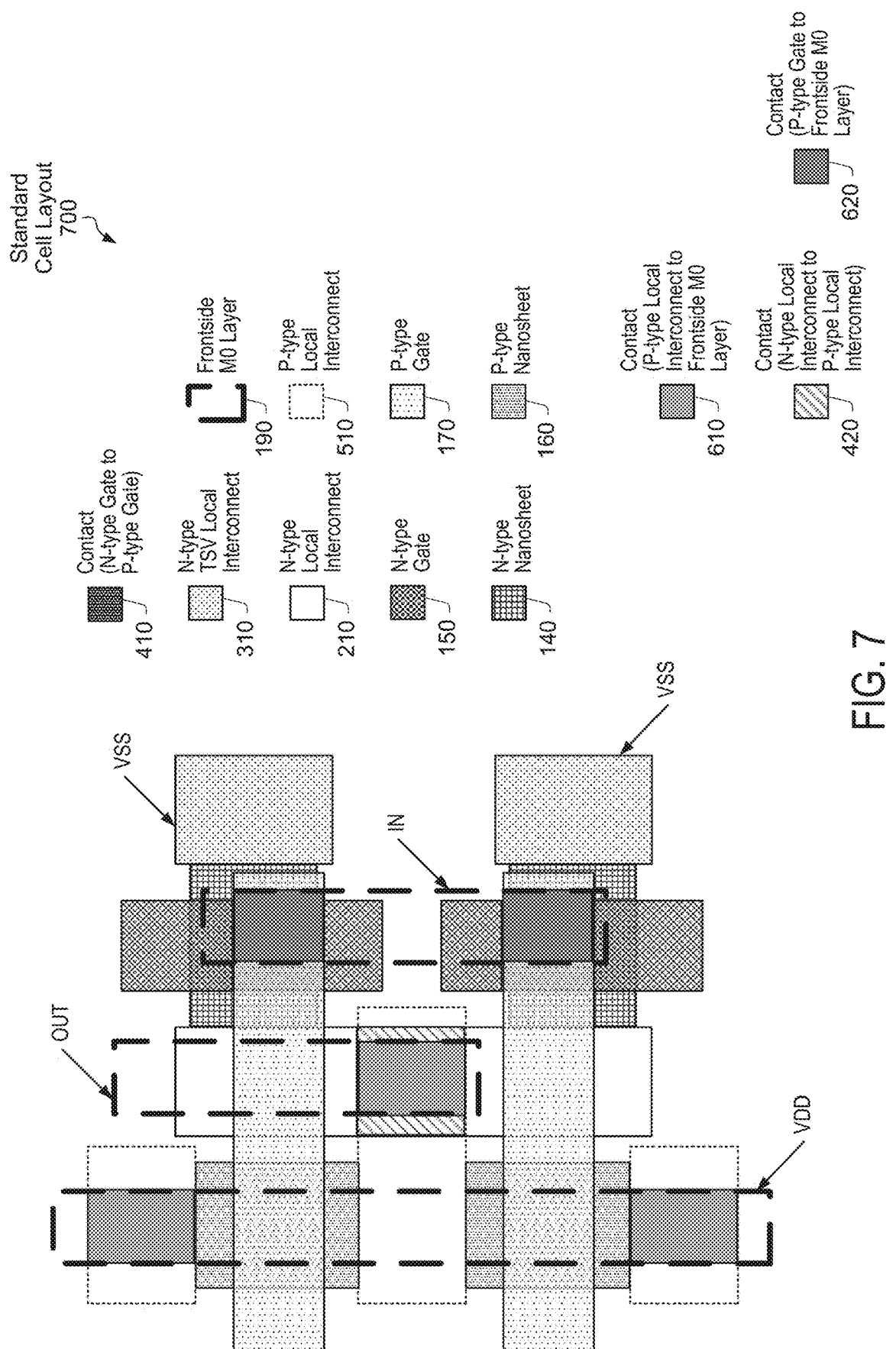

Standard
Cell Layout
700

Contact
(N-type Gate to
P-type Gate)
410

N-type
TSV Local
Interconnect
310

N-type
Local
Interconnect
210

N-type
Gate
150

N-type
Nanosheet
140

Frontside
M0 Layer
190

P-type
Local
Interconnect
510

P-type
Gate
170

P-type
Nanosheet
160

Contact
(P-type Local
Interconnect to
Frontside M0
Layer)
610

Contact
(N-type Local
Interconnect to
P-type Local
Interconnect)
420

Contact
(P-type Gate to
Frontside M0
Layer)
620

FIG. 7

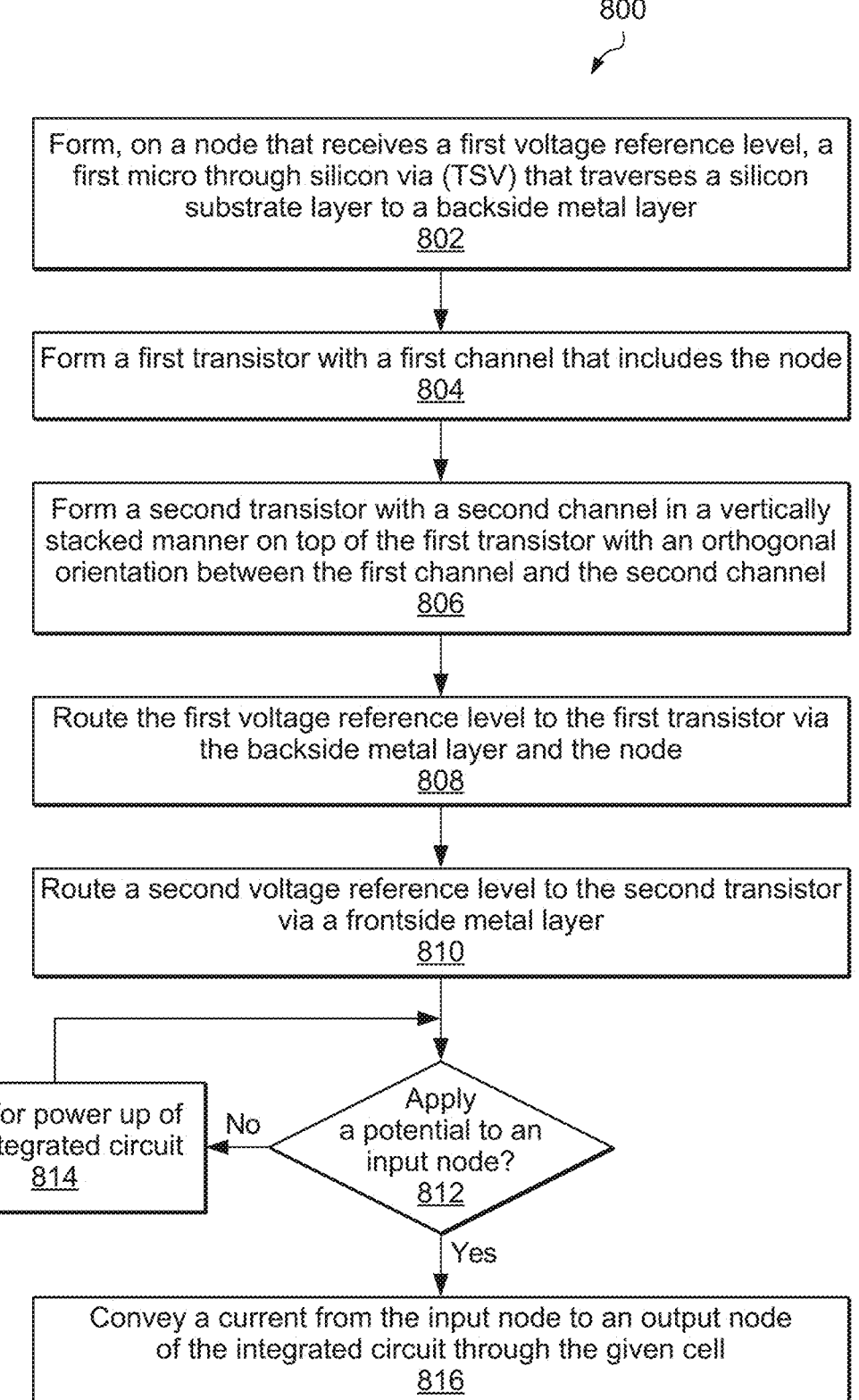

Method
800

Form, on a node that receives a first voltage reference level, a first micro through silicon via (TSV) that traverses a silicon substrate layer to a backside metal layer
802

Form a first transistor with a first channel that includes the node
804

Form a second transistor with a second channel in a vertically stacked manner on top of the first transistor with an orthogonal orientation between the first channel and the second channel
806

Route the first voltage reference level to the first transistor via the backside metal layer and the node
808

Route a second voltage reference level to the second transistor via a frontside metal layer
810

Wait for power up of the integrated circuit
814

No

Apply a potential to an input node?
812

Yes

Convey a current from the input node to an output node of the integrated circuit through the given cell
816

FIG. 8

THREE-DIMENSIONAL CROSS FIELD EFFECT SELF-ALIGNED TRANSISTORS WITH FRONTSIDE AND BACKSIDE POWER CONNECTIONS

BACKGROUND

Description of the Relevant Art

As both semiconductor manufacturing processes advance and on-die geometric dimensions reduce, semiconductor chips provide more functionality and performance. While many advances have been made, design issues still arise with modern techniques in processing and integrated circuit design that limit potential benefits. For example, capacitive coupling, electro migration, short channel effects such as at least leakage currents, and processing yield are some issues which affect the placement of devices and the routing of signals across an entire die of a semiconductor chip. These issues have the potential to delay completion of the design and affect the time to market. Voltage droop of modern integrated circuits has become an increasing design issue with each generation of semiconductor chips. Voltage droop is a reduction in voltage value, or a ΔV, on a node that causes the voltage value to fall below a minimum threshold. For memories and latches without recovery circuitry, stored values can be lost. Voltage droop constraints are not only an issue for portable computers and mobile communication devices, but also for high-performance desktop computers and server computers that use superscalar microprocessors.

In addition, traversing the multiple metal layers to route the power signals across the semiconductor chip increases the distance between contacts to the power signals. This distance widens the floorplan. The floorplan of the semiconductor die is limited unless the semiconductor package size increases. If the area for components of the die is not present in the floorplan, then the components do not fit on the same die. Accordingly, significant redesign is required along with possible moving or shifting of macro blocks in the floorplan. Such redesign consumes an appreciable amount of design time, which delays product releases.

In view of the above, methods and systems for efficiently routing power signals across semiconductor dies are desired.

BRIEF DESCRIPTION OF THE DRAWINGS

FIG. 2 is a generalized block diagram of a top view of a standard cell layout.

FIG. 3 is a generalized block diagram of a top view of a standard cell layout.

FIG. 5 is a generalized block diagram of a top view of a standard cell layout that utilizes power connections routed in a frontside metal layer and a backside metal layer.

FIG. 7 is a generalized block diagram of a top view of a standard cell layout that utilizes power connections routed in a frontside metal layer and a backside metal layer.

FIG. 8 is a generalized block diagram of a method for efficiently creating integrated circuit layout for standard cells.

Figure 1:
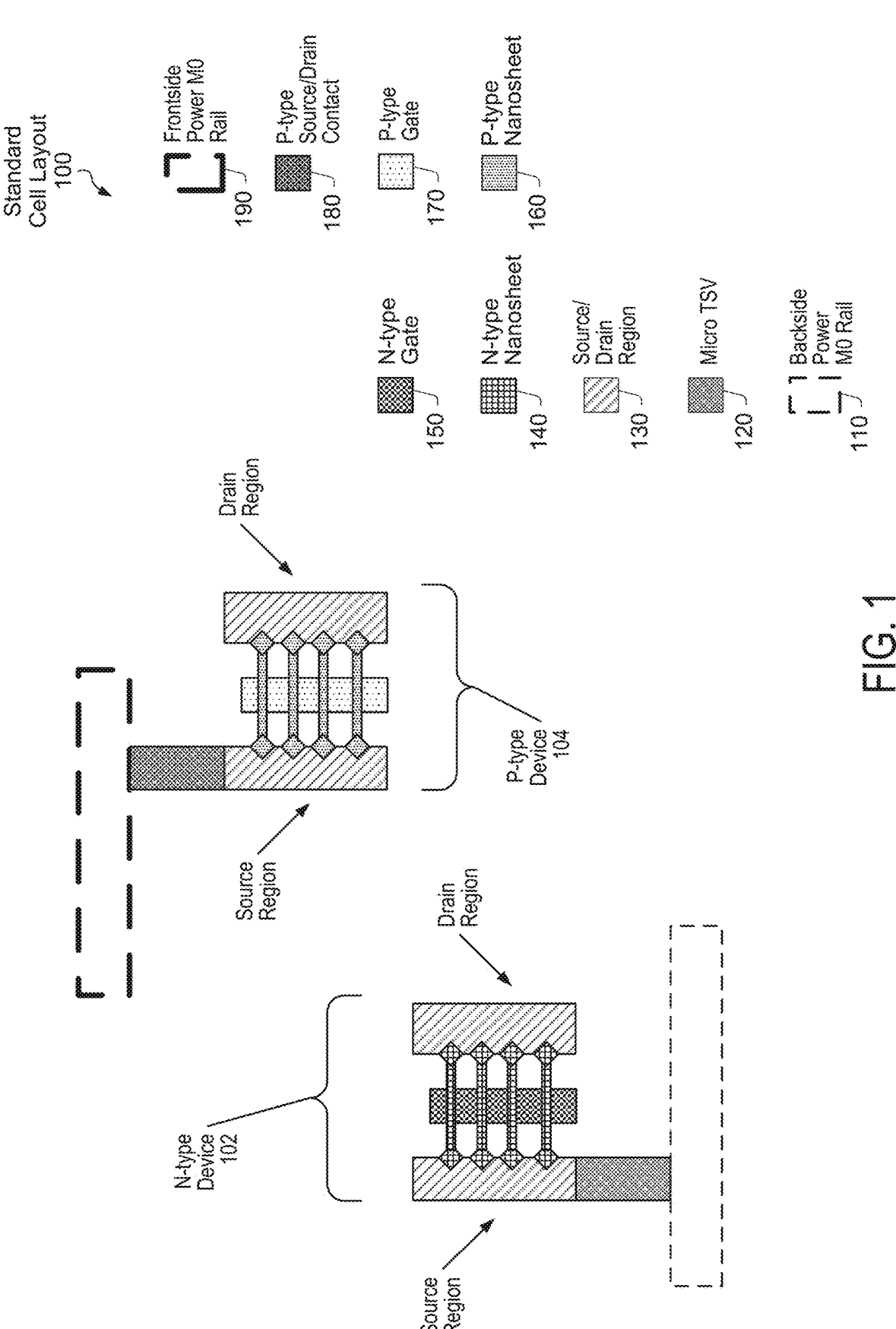
FIG. 1 is a generalized diagram of a cross-section view of a standard cell layout that utilizes power connections routed in a frontside metal layer and a backside metal layer.

While the invention is susceptible to various modifications and alternative forms, specific implementations are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Apparatuses and methods efficiently routing power signals across a semiconductor die are contemplated. In various implementations, an integrated circuit includes a backside power metal zero (or metal 0 or M1 or Metal0) rail located below the silicon substrate layer and any oxide layer, which is used for isolation. A micro through silicon via (TSV) traverses the silicon substrate layer in order to be placed between the backside power M0 rail and the source region of an n-type device. A p-type device has its source region connected to a power supply reference voltage level via a p-type source contact and a frontside power M0 rail. In some implementations, the integrated circuit uses Cross field effect transistors (FETs) with a first device, such as n-type device, having a first channel oriented in a first direction and connected to the ground reference voltage level provided by the backside M0 layer. The Cross FETs also use a second device, such as the p-type device, having a second channel oriented in a second direction orthogonal to the first direction and connected to a power supply reference voltage level provided by the frontside M0 layer. The power connections reduce on-die area, reduces semiconductor fabrication complexity, which improves wafer yield, and reduces voltage droop, which increases performance. Further details of the integrated circuit and power connections are provided in the following description of FIGS. 1-10.

Referring to FIG. 1, a generalized block diagram is shown of a cross-section view of a standard cell layout 100 that utilizes power connections routed in a frontside metal layer and a backside metal layer. The standard cell layout 100 is for any of a variety of types of Boolean gates and complex gates that include transistors arranged in a particular manner for providing data processing functionality or providing data storage. The standard cell layout 100 (or layout 100) uses Cross FETs with a first transistor, such n-type device 104, having a first channel oriented in a first direction and connected to a first voltage level reference provided by a backside metal layer. The Cross FETs also use a second transistor, such as p-type device 102, having a second channel oriented in a second direction orthogonal to the first direction and connected to a second voltage level reference provided by a frontside metal layer. A three-dimensional (3-D) illustration of the p-type and n-type Cross FETs is not shown here for ease of illustration. However, a 3-D illustration accompanies the standard cell layout 200 (of FIG. 2). Although the cross-section view shows each of the two transistors with metal gates oriented in a same direction, the actual placement of these transistors in semiconductor layout includes orthogonal placement with respect to one another.

The backside power metal zero (or metal 0 or M1 or Metal0) rail 110 is located below the silicon substrate layer and any oxide layer (not shown), which is used for isolation. A micro through silicon via (TSV) 120 traverses the silicon substrate layer in order to be placed between the backside power M0 rail 110 and the source region 130 of the n-type device 102. In some implementations, the bottom transistor of layout 100 is an n-type transistor as shown with the source region 130 connected to a ground reference voltage level via the micro TSV 120 and the backside power M0 rail 110. In such an implementation, the top transistor of layout 100 is a p-type transistor as shown with the source region 130 connected to a power supply reference voltage level via the p-type source contact 180 and the frontside power M0 rail 190. In other implementations, the n-type transistor and the p-type transistor are switched along with the types of voltage reference levels connected to the backside power M0 rail 110 and the frontside power M0 rail 190.

Before continuing with a description of the materials of the layout 100, a description of terms used to describe the circuitry is provided here. As used herein, "Cross FETs" are cross field effect transistors (FETs, which are also referred to as a "XFETs." Additionally, as used herein, a "transistor" is also referred to as a "semiconductor device" or a "device." In some implementations, the Cross FETs are vertically stacked gate all around (GAA) transistors such as a top vertical GAA transistor (or GAA transistor) is formed vertically on top of a bottom GAA transistor with at least an isolating oxide layer in between the two GAA transistors. In addition, the top GAA transistor has one or more conducting channels positioned orthogonal to the one or more conducting channels of the bottom GAA transistor. Therefore, the direction of current flow of the top GAA transistor through one or more top channels is orthogonal to the direction of current flow of the one or more bottom channels of the bottom GAA transistor.

The top GAA transistor has a doping polarity of one or more top channels that is an opposite polarity of the doping polarity of one or more bottom channels of the bottom GAA transistor. For example, in an implementation, the top GAA transistor includes one or more p-type channels, whereas the bottom GAA transistor includes one or more n-type channels. In another implementation, the p-type and n-type polarities are reversed between the one or more channels of the top GAA transistor and the bottom GAA transistor. With the orthogonal orientation between the top GAA transistor and the bottom GAA transistor, both the top and bottom GAA transistors have the maximum mobility for their respective carriers based on their orientation.

The "micro TSV" 120 is a through silicon via that traverses through the silicon substrate layer from the backside power M0 rail 110 to the source region 130, and ends with physical contact at each of the backside power M0 rail 110 to the source region 130. The distance between the backside power M0 rail 110 to the source region 130 defines the height or length of the micro TSV 120, which traverses only the silicon substrate layer and any oxide layer above the backside power M0 rail 110. The micro TSV 110 does not physically extend into multiple insulation layers of a semiconductor die used for routing multiple frontside metal layers. Similarly, the micro TSV 110 does not physically extend into multiple insulation layers of the semiconductor die used for routing multiple backside metal layers.

Although the orientation of the standard cell layout 100 (or layout 100) is shown to have each of the backside power M0 rail 110 and the frontside power M0 rail 190 routed in the horizontal direction, other orientations are possible and contemplated. It is understood that a silicon wafer, an integrated circuit, and a semiconductor package using the silicon substrate layer can be rotated and flipped. Therefore, the materials and layers being described would be rotated and flipped, and the orientations and directions would have a different meaning. Therefore, the terms "top," "bottom," "horizontal," "vertical," "above," and "below" can change as the layout 100 is rotated or flipped, and the use of these terms in the below description correspond to the orientation being shown in the layout 100.

As used herein, a "terminal" of a transistor is also referred to as a "region" of a transistor. For example, a source region is also referred to as a source terminal, a drain region is also referred to as a drain terminal, and a gate region is also referred to as a gate terminal. The source and drain region are typically formed in a same orientation (horizontal or vertical) as corresponding gate metal of a same device. Examples of the source and drain regions are trench silicide contacts. In some implementations, the source and drain regions include Cobalt silicide ($CoSi_2$). In other implementations, the source and drain regions include Titanium silicide ($TiSi_2$) or ruthenium (Ru).

For ease of illustration, multiple layers are not shown, which are used to complete the circuitry of the layout 100. For example, at least active regions, local interconnect layers, and upper metal layers (metal one to metal twelve or higher) and corresponding contacts are not shown. In the illustrated implementation, the p-type device 104 is vertically stacked on an n-type device 102. However, as described earlier, in other implementations, the devices are switched with regard to the vertical stacking in the layout 100. The n-type device 102 includes at least an n-type gate 150 formed all around an n-type channel 140. Similarly, the p-type device 104 includes a p-type gate 170 is formed all around a p-type channel 180. Therefore, the p-type channel 160 has a doping polarity that is an opposite polarity of the n-type channel 104 of the bottom n-type device. In some implementations, the channels are lateral nanowires, whereas, in other implementations, the channels are nanosheets.

The n-type channel 140 and the n-type gate 150 are oriented in an orthogonal direction to the p-type channel 160 and the p-type gate 170. In other words, the n-type channel 140 and the n-type gate 150 are oriented in a direction that is 90 degrees from a direction of the p-type channel 160 and the p-type gate 170. The direction of current flow of the n-type device 102 through the n-type channel 140 is orthogonal to the direction of current flow of the p-type device 104 through the p-type channel 160. With the orthogonal orientation between the top p-type device 104 and the bottom n-type device 102, both devices have the maximum mobility for their respective carriers based on their orientation.

To transport current from an off-chip power supply to p-type device 104, the current flows from the off-chip power supply to multiple frontside metal layers to the frontside power M0 rail 190 to the source region 130 of the p-type device 104. To transport current from an off-chip ground reference to n-type device 102, the current flows from the off-chip ground reference to one or more backside metal layers to the backside power M0 rail 110 to the source region 130 of the n-type device 102. In some implementations, a single, thick backside metal layer is used to transport the ground reference, rather than multiple, think backside metal layers to reduce semiconductor fabrication costs. The power connections shown in layout 100 reduces on-die area, reduces semiconductor fabrication complexity, which improves wafer yield, and reduces voltage droop, which increases performance.

Turning now to FIG. 2, a generalized block diagram is shown of a top view of a standard cell layout 200. Contacts (or vias), materials and structures described earlier are numbered identically. The standard cell layout 200 (as well as layout 300-700 of FIGS. 3-7) is for an inverter using Cross FETs. A three-dimensional (3-D) illustration of the p-type and n-type Cross FETs accompanies the layout 200. It is noted that the placement of the p-type and n-type Cross FETs in the 3-D illustration shows the devices aligned vertically with one another. However, these devices are actually moved to be less vertically aligned as will be shown in the semiconductor layouts 200-700 (of FIGS. 2-7) to allow for both frontside power connections and backside power connections.

The top view of the layout 300 is shown on the right, and the cross-sectional view is shown on the left. For this inverter, a p-type device is being vertically stacked on an n-type device. However, in other implementations, it is possible and contemplated to have an n-type device vertically stacked on a p-type device. Each of the devices of the inverter uses gate all around (GAA) metal that wraps around one or more nanosheets in the gate region in a 360-degree manner. The bottom n-type device is fabricated on a first wafer. The top p-type device is fabricated on a separate second wafer, which is then bonded to the first wafer as described later.

Here, in layout 200, the n-type nanosheets 140 are created from a stack of alternating layers such as a silicon germanium semiconducting epitaxial growth layer alternating with a silicon semiconducting epitaxial growth layer. The layers are etched to the size of the n-type nano sheets 140 using one of a sidewall image transfer (SIT) process, extreme ultra- violet (EUV) lithography, directed self-assembly (DSA) patterning via chemo epitaxy or self-aligned customization. In other implementations, the alternating layers are grown on top of a silicon on insulator (SOI) oxide layer followed by an etching step. A given conduction layer of the alter- nating silicon germanium semiconducting epitaxial growth layer and silicon semiconducting epitaxial growth layer is selected to remain for forming the gate region. Afterward, any semiconducting layer other than the selected layer is removed. The n-type gate metal material 150 is deposited followed by chemical mechanical planarization (CMP) steps to polish the n-type gate metal 150. In various implemen- tations, titanium nitride (TiN) is used for the n-type gate metal 150. The n-type gate metal 150 is provided all around the n-type nanosheets 140 in a 360-degree manner. An interlayer dielectric (ILD) oxide layer is deposited around the gate region. Afterward, the n-type local interconnect 210 is formed. In some implementations, the n-type local inter- connect 210 includes the tungsten, cobalt, ruthenium, or molybdenum.

Figure 4:
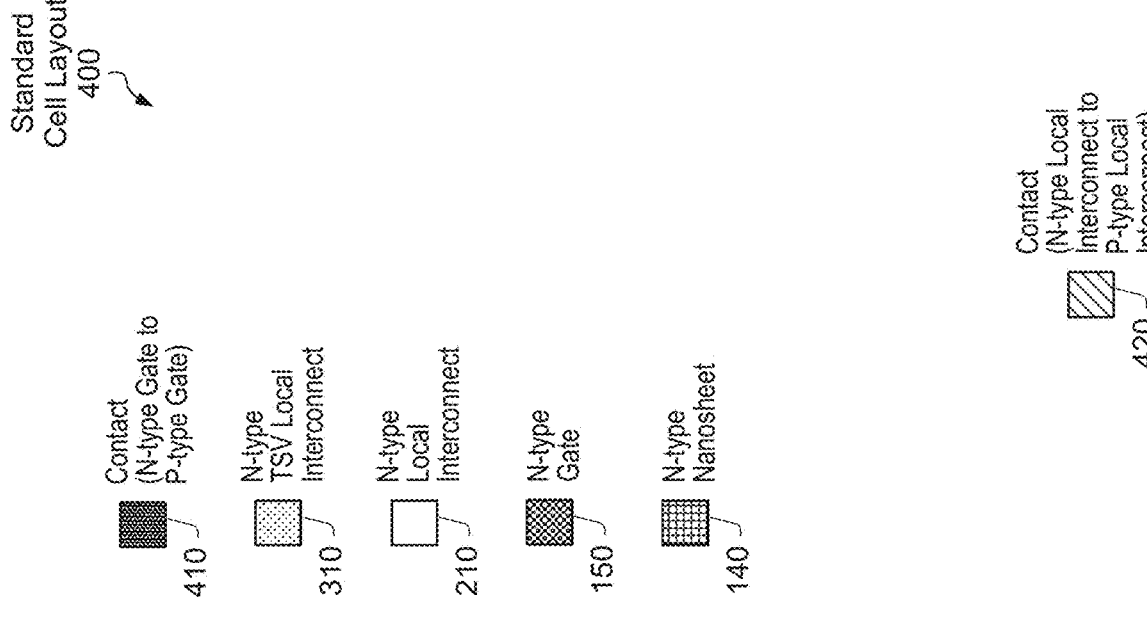
FIG. 4 is a generalized block diagram of a top view of a standard cell layout.

Referring to FIG. 3 and FIG. 4, generalized block dia- grams are shown of a top view of a standard cell layout 300 and a standard cell layout 400. Contacts (or vias), materials and structures described earlier are numbered identically. In the standard cell layout 300, the n-type TSV local intercon- nect 310 is formed in the locations where later connections to a micro TSV are placed. In the layout 400, the contacts 410 are formed on particular locations of the n-type gate 150. The contacts 410 are used to connect an n-type gate 150 to a p-type gate.

Turning now to FIG. 5, a generalized block diagrams is shown of a top view of a standard cell layout 500 (or layout 500). Contacts (or vias), materials and structures described earlier are numbered identically. In the layout 500, the p-type nanosheets 160 are created in a similar manner as the n-type nanosheets 140, but using a different doping polarity. For active regions of p-type devices doping can occur with Boron or Gallium during a semiconductor fabrication pro- cess. For active regions of n-type devices doping can occur with Phosphorous or Arsenic during a semiconductor fab- rication process. The p-type gate metal material 170 is deposited followed by CMP steps to polish the p-type gate metal 170. In various implementations, titanium nitride (TiN) is used for the p-type gate metal 170. The p-type gate metal 170 is provided all around the p-type nanosheets 160 in a 360-degree manner. An interlayer dielectric (ILD) oxide layer is deposited around the gate region. Afterward, the p-type local interconnect 510 is formed. In some implemen- tations, the n-type local interconnect 210 includes the tung- sten, cobalt, ruthenium, or molybdenum.

Figure 6:
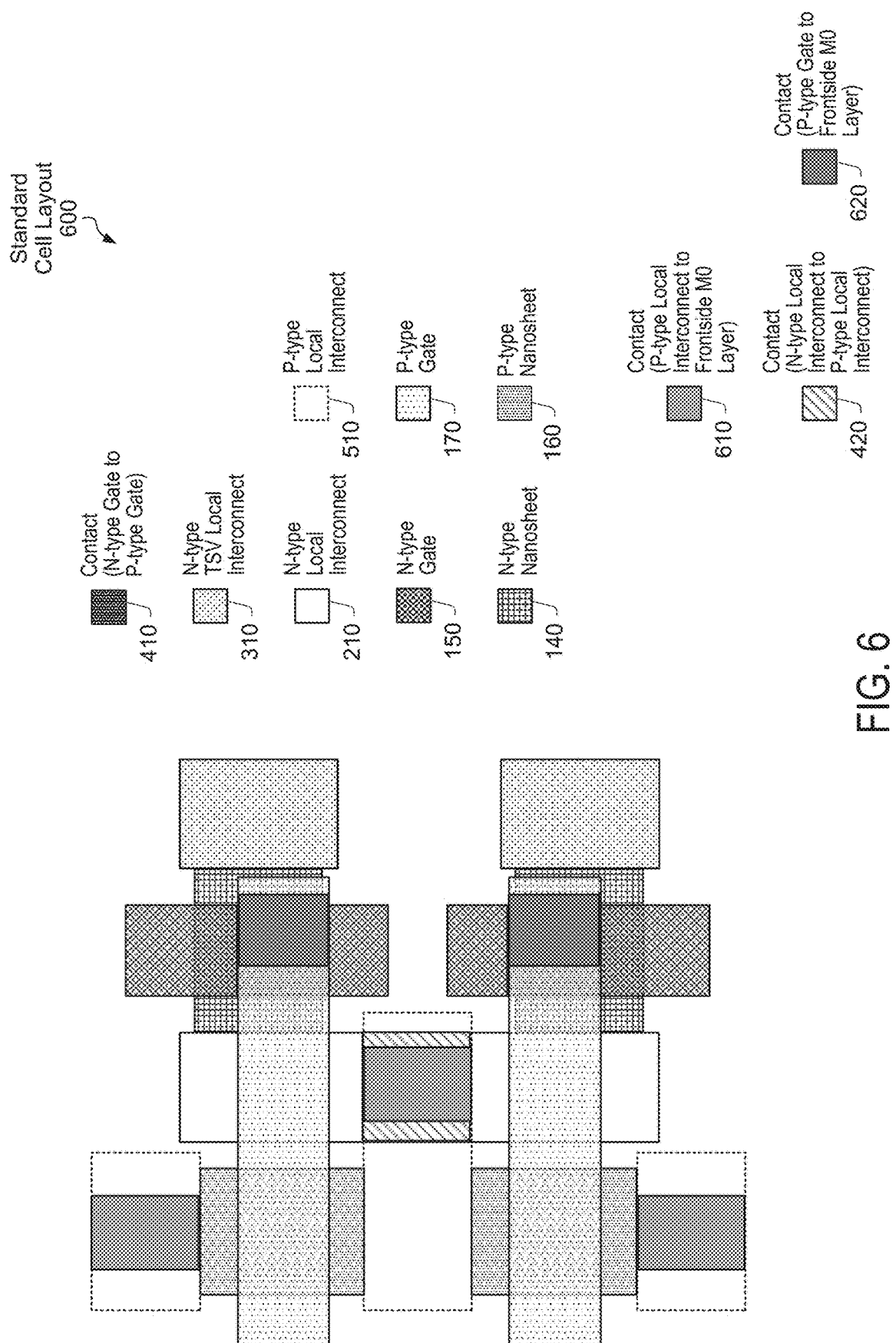
FIG. 6 is a generalized block diagram of a top view of a standard cell layout that utilizes power connections routed in a frontside metal layer and a backside metal layer.

Turning now to FIG. 6 and FIG. 7, generalized block diagrams are shown of a top view of a standard cell layout 600 (or layout 600) and a standard cell layout 700 (or layout 700). Contacts (or vias), materials and structures described earlier are numbered identically. In the layout 600, contacts 610 and 620 are formed. Contacts 610 are used to connect p-type local interconnect 510 to frontside M0 layer 190 to be formed later. Contacts 620 are used to connect p-type gate 170 to the frontside M0 layer 190 to be formed later. In the layout 700, the frontside M0 layer 190 is formed to complete the connections of the Cross FET inverter. The nodes "IN" and "OUT" as well as the power connections "VDD" and "VSS" are labeled on the layout 700 for the Cross FET inverter. The power connections shown in layout 700 reduces on-die area, reduces semiconductor fabrication complexity, which improves wafer yield, and reduces volt- age droop, which increases performance.

Referring now to FIG. 8, a generalized block diagram is shown of a method 800 for efficiently creating integrated circuit layout for standard cells that utilizes techniques to reduce voltage droop and reduce on-die area. For purposes of discussion, the steps in this implementation are shown in sequential order. However, in other implementations some steps occur in a different order than shown, some steps are performed concurrently, some steps are combined with other steps, and some steps are absent.

A semiconductor fabrication process (or process) forms, on a first node of an integrated circuit that receives a first voltage reference level, a first micro through silicon via (TSV) that traverses a silicon substrate layer to a backside metal layer (block 802). The process forms a first transistor with a first channel (block 804). The process forms a second transistor with a second channel in a vertically stacked manner on top of the first transistor with an orthogonal orientation between the first channel and the second channel (block 806). The process additionally places cells, such as standard cells, in the integrated circuit. In some implementations, each of the first transistor and the second transistor as well as transistors in the standard cells is formed as a vertical gate all around (GAA) device or other type of non-planar device. In various implementations, the process uses a first doping polarity for the first channel that is an opposite doping polarity of the second channel. For example, the first transistor is an n-type transistor with an n-type channel, and the second transistor is a p-type transistor with a p-type channel.

The processor routes the first voltage reference level to the first transistor via the backside metal layer and the node (block 808). The process routes a second voltage reference level to the second transistor via a frontside metal layer (block 810). In some implementations, the first voltage reference level is a ground reference voltage level routed to n-type transistors and the second voltage reference level is a power supply reference voltage level routed to p-type transistors. If a potential is not applied to an input node of the integrated circuit ("no" branch of the conditional block 812), then the integrated circuit waits for power up (block 814). However, if a potential is applied to the input node of the integrated circuit ("yes" branch of the conditional block 810), then the integrated circuit conveys a current from the input node to an output node through the given cell (block 816).

Figure 9:
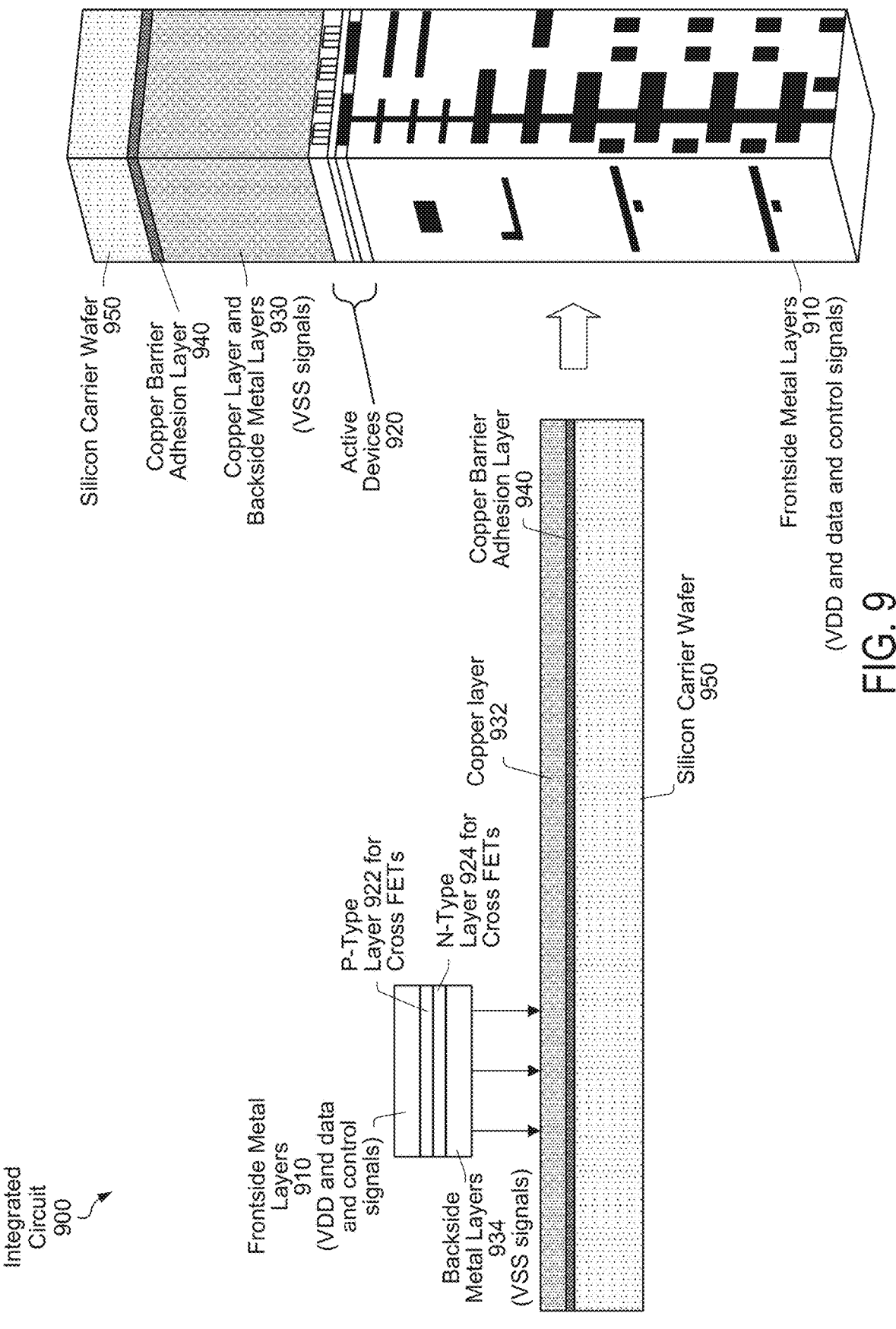
FIG. 9 is a generalized block diagram of an integrated circuit that utilizes power connections routed in a frontside metal layer and a backside metal layer.

Referring to FIG. 9, a generalized block diagram is shown of an integrated circuit 900 with standard cells that utilizes techniques to reduce voltage droop and reduce on-die area. The left side of FIG. 9 shows a cross-section view of the integrated circuit 900 as it is being formed. The right side of FIG. 9 shows a cross-section view of the integrated circuit 900 after it is formed, which includes flipping the components. Beginning with the cross-section view on the right, the frontside metal layers 910 (or layers 910) include multiple metal layers used for routing data signals, control signals, and power supply reference voltage levels. The layers 910 make contact with interconnects such as micro bumps (not shown) placed in a semiconductor package that includes the integrated circuit 900. The active devices 920 use the multiple frontside signals to process a variety of applications using source data. In various implementations, the active devices 920 include Cross FETs formed with techniques described earlier for the standard cell layouts 100-700 (of FIGS. 1-7). In an implementation, the layers 910 provide power supply reference voltage levels to p-type devices of a p-type layer 922 of the active devices 920. In other implementations, the p-type layer 922 and the n-type layer 924 are switched, and the layers 910 provide ground reference voltage levels to n-type devices of the active devices 920.

The layers 930 include the backside metal layers 934 that provide ground reference voltage levels to n-type devices of the n-type layer 924 of the active devices 920. In other implementations, the p-type layer 922 and the n-type layer 924 are switched, and the layers 930 provide power supply reference voltage levels to p-type devices of the p-type layer 922 of the active devices 920. The layers 930 also include a copper layer 932. The copper layer 932 also dissipates thermal energy away from the active devices 920. The copper barrier adhesion layer 940 (or layer 940) prevents copper diffusion into the adjacent underlying silicon carrier wafer 950. The silicon carrier wafer 950 provides support and structure throughout the semiconductor fabrication process. A heat sink is typically placed above the silicon carrier wafer 950. In another implementation, the copper layer 932 is a single, thick copper backside layer with an oxide layer on the other side opposite the side that makes contact with the backside metal layers 934. In addition, the silicon carrier wafer 950 has a thin oxide layer. The thin thickness of this oxide layer of the silicon carrier wafer 950 reduces resistance to thermal transport. The oxide layer of the copper layer 932 is bonded with the oxide layer of the silicon carrier wafer 950.

Figure 10:
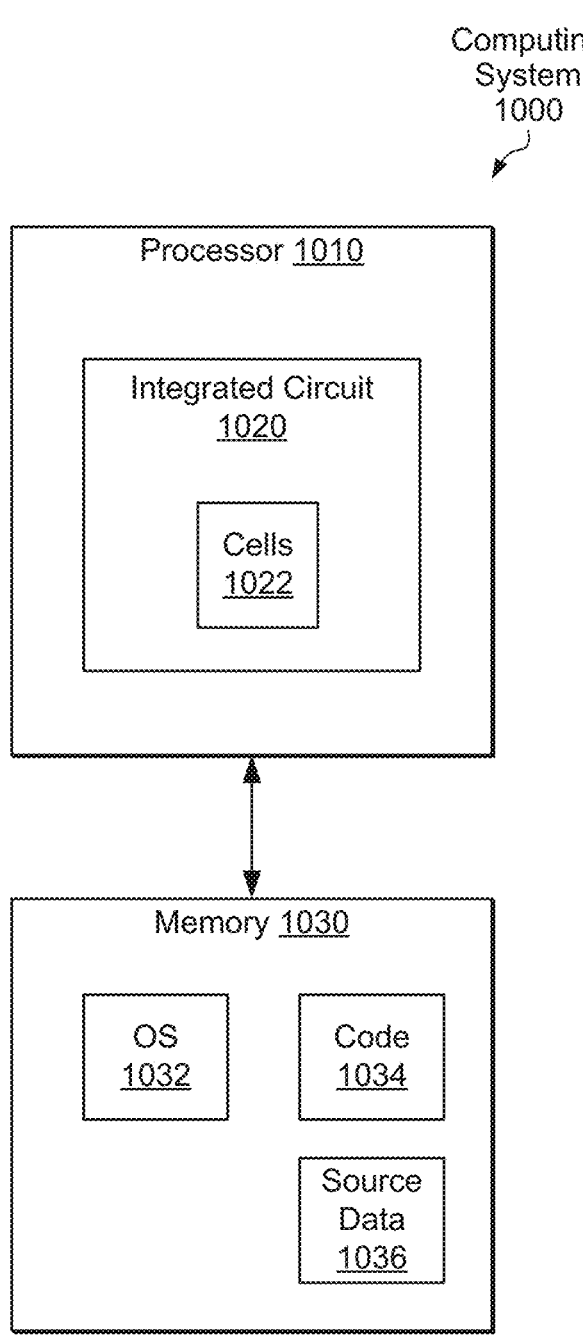
FIG. 10 is a generalized block diagram is shown of a computing system with standard cells that utilize power connections routed in a frontside metal layer and a backside metal layer.

Referring to FIG. 10, a generalized block diagram is shown of a computing system 1000 with standard cells that utilizes techniques to reduce voltage droop and reduce on-die area. The computing system 1000 includes the processor 1010 and the memory 1030. Interfaces, such as a memory controller, a bus, or a communication fabric, one or more phased locked loops (PLLs) and other clock generation circuitry, a power management unit, and so forth, are not shown for ease of illustration. It is understood that in other implementations, the computing system 1000 includes one or more of other processors of a same type or a different type than processor 1010, one or more peripheral devices, a network interface, one or more other memory devices, and so forth. In some implementations, the functionality of the computing system 1000 is incorporated on a system on chip (SoC). In other implementations, the functionality of the computing system 1000 is incorporated on a peripheral card inserted in a motherboard. The computing system 1000 is used in any of a variety of computing devices such as a desktop computer, a tablet computer, a laptop, a smartphone, a smartwatch, a gaming console, a personal assistant device, and so forth.

The processor 1010 includes hardware such as circuitry. For example, the processor 1010 includes at least one integrated circuit 1020. The integrated circuit 1020 includes cells 1022 where one or more of these cells 1022 uses Cross FETs with a first transistor having a first channel oriented in a first direction and connected to a first voltage level reference provided by a backside metal layer. The Cross FETs also use a second transistor having a second channel oriented in a second direction orthogonal to the first direction and connected to a second voltage level reference provided by a frontside metal layer. The formation of the Cross FETs of cells 1022 uses techniques performed for the standard cell layouts 100-700 (of FIGS. 1-7) and integrated circuit 900 (of FIG. 9).

In some implementations, the processor 1010 includes one or more processing units. In some implementations, each of the processing units includes one or more processor cores capable of general-purpose data processing, and an associated cache memory subsystem. In such an implementation, the processor 1010 is a central processing unit (CPU). In another implementation, the processing cores are compute units, each with a highly parallel data microarchitecture with multiple parallel execution lanes and an associated data storage buffer. In such an implementation, the processor 1010 is a graphics processing unit (GPU), a digital signal processor (DSP), or other.

In some implementations, the memory 1030 includes one or more of a hard disk drive, a solid-state disk, other types of flash memory, a portable solid-state drive, a tape drive and so on. The memory 1030 stores an operating system (OS) 1032, one or more applications represented by code 1034, and at least source data 1036. Memory 1030 is also capable of storing intermediate result data and final result data generated by the processor 1010 when executing a particular application of code 1034. Although a single operating system 1032 and a single instance of code 1034 and source data

1036 are shown, in other implementations, another number of these software components are stored in memory 1030. The operating system 1032 includes instructions for initiating the boot up of the processor 1010, assigning tasks to hardware circuitry, managing resources of the computing system 1000 and hosting one or more virtual environments.

Each of the processor 1010 and the memory 1030 includes an interface unit for communicating with one another as well as any other hardware components included in the computing system 1000. The interface units include queues for servicing memory requests and memory responses, and control circuitry for communicating with one another based on particular communication protocols. The communication protocols determine a variety of parameters such as supply voltage levels, power-performance states that determine an operating supply voltage and an operating clock frequency, a data rate, one or more burst modes, and so on.

It is noted that one or more of the above-described implementations include software. In such implementations, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g., synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g., Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various implementations, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases, the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the implementations above have been described in considerable detail, numerous variations and modifications will become apparent to those skilled in the art once the above disclosure is fully appreciated. It is intended that the following claims be interpreted to embrace all such variations and modifications.

What is claimed is:

1. An integrated circuit comprising:
a first transistor comprising a first channel oriented in a first direction;
an oxide layer adjacent to the first transistor;
a second transistor adjacent to the oxide layer, wherein the second transistor comprises a second channel that is oriented in a direction orthogonal to the first direction; and
a backside power metal layer below a silicon substrate of the integrated circuit, wherein the backside metal layer forms a first power rail, is connected to the second transistor, and is configured to route a first voltage reference level of the first power rail.

2. The integrated circuit as recited in claim 1, further comprising a frontside metal layer that forms a second power rail, is connected to the first transistor, and is configured to route a second voltage reference level of the second power rail.

3. The integrated circuit as recited in claim 2, wherein a first doping polarity of the first channel is an opposite polarity of a second doping polarity of the second channel.

4. The integrated circuit as recited in claim 2, wherein the first voltage reference level is different from the second voltage reference level.

5. The integrated circuit as recited in claim 2, further comprising a micro through silicon via (TSV) that traverses through the silicon substrate between a source region of the second transistor and the backside metal layer.

6. The integrated circuit as recited in claim 2, further comprising a heat sink located nearer a plurality of backside metal layers than a plurality of frontside metal layers.

7. The integrated circuit as recited in claim 6, further comprising a copper barrier adhesion layer between the plurality of backside metal layers and a carrier wafer.

8. A method comprising:
forming, in an integrated circuit, a first transistor with a first channel oriented in a first direction;
forming, in the integrated circuit, an oxide layer adjacent to the first transistor;
forming, in the integrated circuit, a second transistor adjacent to the oxide layer, wherein the second transistor comprises a second channel that is oriented in a direction orthogonal to the first direction; and
forming a backside metal layer below a silicon substrate of the integrated circuit, wherein the backside metal layer forms a first power rail, is connected to the second transistor, and is configured to route a first voltage reference level of the first power rail.

9. The method as recited in claim 8, further comprising forming a frontside metal layer that forms a second power rail, is connected to the first transistor, and routes a second voltage reference level of the second power rail.

10. The method as recited in claim 9, further comprising forming the first channel with a first doping polarity that is an opposite polarity of a second doping polarity of the second channel.

11. The method as recited in claim 9, wherein the first voltage reference level is different from the second voltage reference level.

12. The method as recited in claim 9, further comprising forming a micro through silicon via (TSV) that traverses through the silicon substrate layer between a source region of the second transistor and the backside metal layer.

13. The method as recited in claim 9, further comprising forming a heat sink located nearer a plurality of backside metal layers than a plurality of frontside metal layers.

14. The method as recited in claim 13, further comprising forming a copper barrier adhesion layer between the plurality of backside metal layers and a carrier wafer.

15. A computing system comprising:

a memory configured to store instructions of one or more tasks and source data to be processed by the one or more tasks;

an integrated circuit configured to execute the instructions of the one or more tasks using the source data, wherein the integrated circuit comprises:

a first transistor comprising a first channel oriented in a first direction;

an oxide layer adjacent to the first transistor;

a second transistor adjacent to the oxide layer, wherein the second transistor comprises a second channel that is oriented in a direction orthogonal to the first direction; and a backside metal layer below a silicon substrate of the integrated circuit, wherein the backside metal layer forms a first power rail, is connected to the second transistor, and is configured to route a first voltage reference level of the first power rail.

16. The computing system as recited in claim 15, wherein the integrated circuit further comprises a frontside metal layer that forms a second power rail, is connected to the first transistor, and is configured to route a second voltage reference level of the second power rail.

17. The computing system as recited in claim 16, wherein a first doping polarity of the first channel is an opposite polarity of a second doping polarity of the second channel.

18. The computing system as recited in claim 16, wherein the first voltage reference level is different from the second voltage reference level.

19. The computing system as recited in claim 16, wherein the integrated circuit further comprises a micro through silicon via (TSV) that traverses through the silicon substrate between a source region of the second transistor and the backside metal layer.

20. The computing system as recited in claim 16, wherein the integrated circuit further comprises a heat sink located nearer a plurality of backside metal layers than a plurality of frontside metal layers.

* * * * *